(12) United States Patent
Sun et al.

(10) Patent No.: US 11,196,434 B1
(45) Date of Patent: Dec. 7, 2021

(54) SUCCESSIVE APPROXIMATION REGISTER (SAR) ANALOG-TO-DIGITAL CONVERTER (ADC) WITH NOISE-SHAPING PROPERTY

(71) Applicant: QUALCOMM Incorporated, San Diego, CA (US)

(72) Inventors: Lei Sun, San Diego, CA (US); Honghao Ji, San Diego, CA (US); Dan Yuan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/062,193

(22) Filed: Oct. 2, 2020

(51) Int. Cl.
*H03M 1/38* (2006.01)
*H03M 1/06* (2006.01)

(52) U.S. Cl.
CPC ................................ *H03M 1/0626* (2013.01)

(58) Field of Classification Search
CPC .... H03M 1/0626; H03M 1/468; H03M 1/804; H03M 1/466; H03M 3/426; H03M 1/00; H03M 1/001; H03M 1/02; H03M 1/06; H03M 1/0682; H03M 1/1033; H03M 1/1047; H03M 1/124; H03M 1/1245; H03M 1/1295; H03M 1/442; H03M 1/66; H03M 1/687; H03M 1/747; H03M 1/765; H03M 3/32; H03M 3/436
USPC ................. 341/143, 155, 161, 172
See application file for complete search history.

(56) References Cited

U.S. PATENT DOCUMENTS

| | | | |
|---|---|---|---|
| 8,102,292 B1 * | 1/2012 | Van Ess | H03M 3/426 341/143 |
| 9,369,140 B1 | 6/2016 | Sundaresan | |
| 9,425,818 B1 * | 8/2016 | Rajaee | H03M 3/32 |
| 9,455,733 B1 | 9/2016 | Wu | |
| 9,685,974 B1 * | 6/2017 | Sugimoto | H03M 1/66 |
| 10,498,353 B2 * | 12/2019 | Huang | H03M 3/426 |
| 10,784,883 B1 | 9/2020 | Tripathi et al. | |
| 10,979,059 B1 * | 4/2021 | Shalmani | H03L 7/0992 |

(Continued)

FOREIGN PATENT DOCUMENTS

| TW | 422160 B | 1/2014 |
|---|---|---|
| TW | 201824753 A | 7/2018 |

OTHER PUBLICATIONS

Chen Z., et al., "A 9.35-ENOB, 14.8 fJ/conv.—step Fully-Passive Noise-Shaping SAR ADC", Symposia on VLSI Technology and Circuits, 2015, 27 pages.

*Primary Examiner* — Linh V Nguyen
(74) *Attorney, Agent, or Firm* — Patterson+Sheridan, L.L.P.

(57) ABSTRACT

Certain aspects of the present disclosure provide a successive approximation register (SAR) analog-to-digital converter (ADC) implemented with a digital filter for noise shaping. For example, certain aspects provide a circuit for analog-to-digital conversion having: a first digital-to-analog converter (DAC) having an output coupled to a sampling node; a comparator having an input coupled to the sampling node; SAR logic having an input coupled to an output of the comparator and at least one output coupled to an input of the first DAC; a quantizer configured to generate a first digital signal representing a voltage at the sampling node; a digital filter configured to apply a filter to the first digital signal; and a second DAC configured to generate an analog signal representing the filtered first digital signal and provide the analog signal to the sampling node.

14 Claims, 7 Drawing Sheets

(56) References Cited

U.S. PATENT DOCUMENTS

| | | |
|---|---|---|
| 2010/0001892 A1 | 1/2010 | Aruga et al. |
| 2010/0164761 A1 | 7/2010 | Wan et al. |
| 2012/0286981 A1* | 11/2012 | Satarzadeh ......... H03M 1/1265 |
| | | 341/122 |
| 2014/0070972 A1* | 3/2014 | Morgado ................ H03M 3/32 |
| | | 341/143 |
| 2018/0083647 A1* | 3/2018 | Yoshioka .............. H03M 1/804 |

* cited by examiner

US 11,196,434 B1

SUCCESSIVE APPROXIMATION REGISTER (SAR) ANALOG-TO-DIGITAL CONVERTER (ADC) WITH NOISE-SHAPING PROPERTY

TECHNICAL FIELD

Certain aspects of the present disclosure generally relate to electronic circuits and, more particularly, to a successive approximation register (SAR) analog-to-digital converter (ADC).

BACKGROUND

Many electronic devices include one or more analog-to-digital converters (ADCs), for converting analog signals to digital signals for additional processing in the digital domain. Several types of ADCs are available, each with varying advantages and disadvantages. For example, a successive approximation register (SAR) ADC may provide an area and power-efficient architecture for low-to-medium accuracy analog-to-digital conversion applications. A SAR ADC may use a comparator and logic to approximate a digital value corresponding to an analog input. Another type of ADC is referred to as a flash ADC, which may provide a faster conversion speed at the cost of an exponential increase in power and area consumption.

SUMMARY

Certain aspects of the present disclosure generally relate to a successive approximation register (SAR) analog-to-digital converter (ADC) implemented with a digital filter for noise shaping.

Certain aspects provide a circuit for analog-to-digital conversion. The circuit generally includes: a first digital-to-analog converter (DAC) having an output coupled to a sampling node; a comparator having an input coupled to the sampling node; successive approximation register (SAR) logic having an input coupled to an output of the comparator and at least one output coupled to an input of the first DAC; a quantizer configured to generate a first digital signal representing a voltage at the sampling node; a digital filter configured to apply a filter to the first digital signal; and a second DAC configured to generate an analog signal representing the filtered first digital signal and provide the analog signal to the sampling node.

Certain aspects provide a method for analog-to-digital conversion. The method generally includes: comparing, via a comparator, a sampled input voltage at a sampling node to a reference voltage; controlling, via SAR logic, a first DAC having an output coupled to the sampling node based on the comparison to generate a first digital signal; generating a second digital signal representing a voltage remaining at the sampling node after the first digital signal is generated; filtering the second digital signal; and controlling a second DAC having an output coupled to the sampling node based on the filtered second digital signal.

Certain aspects provide an apparatus for analog-to-digital conversion. The apparatus generally includes: means for comparing, via a comparator, a sampled input voltage at a sampling node to a reference voltage; means for controlling, via SAR logic, a first DAC having an output coupled to the sampling node based on the comparison to generate a first digital signal; means for generating a second digital signal representing a voltage remaining at the sampling node after the first digital signal is generated; means for filtering the second digital signal; and means for controlling a second DAC having an output coupled to the sampling node based on the filtered second digital signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
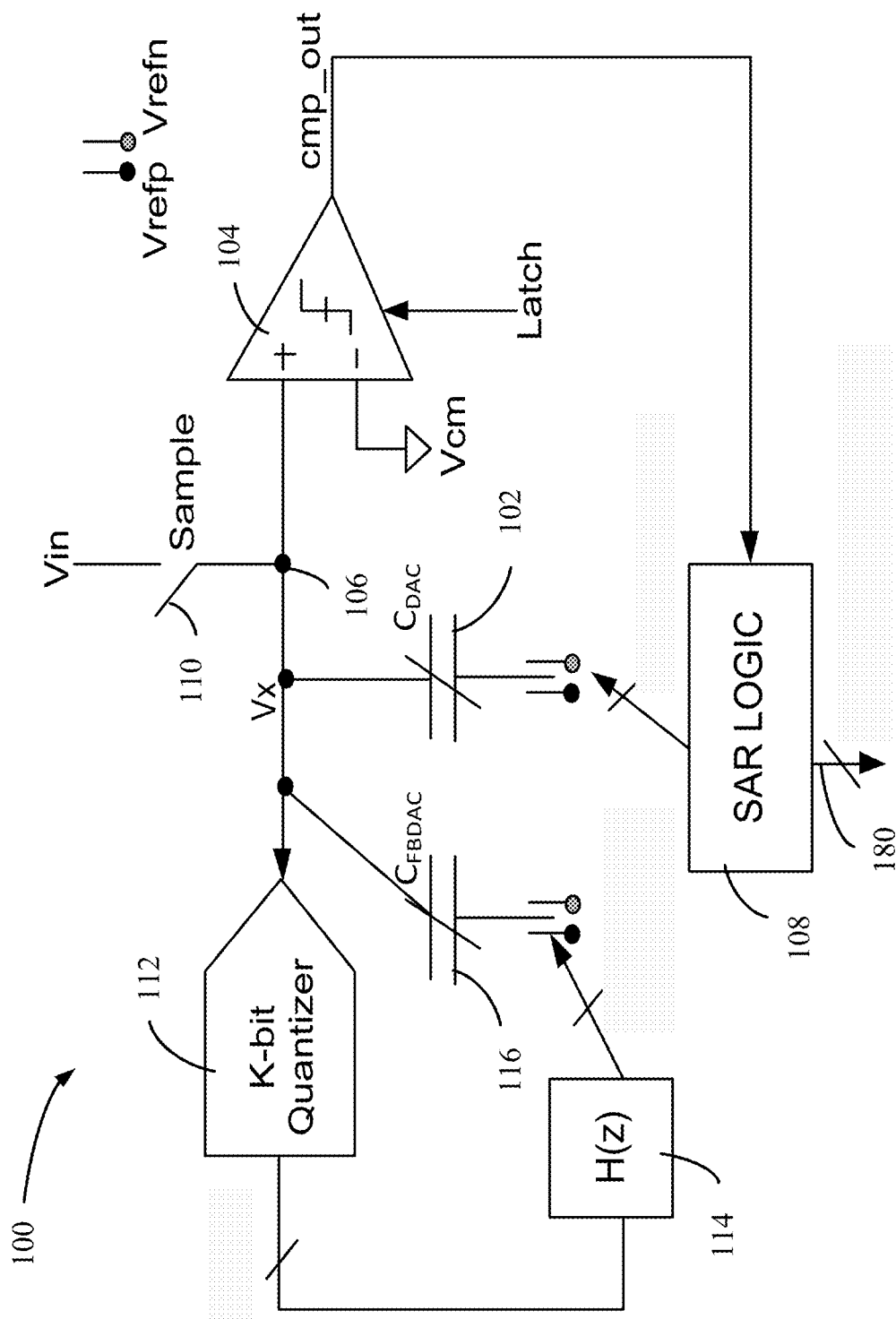
FIG. 1 is a block diagram illustrating a successive approximation register (SAR) analog-to-digital converter (ADC) implemented with residual error processing circuitry, in accordance with certain aspects of the present disclosure.

Certain aspects of the present disclosure generally relate to a successive approximation register (SAR) analog-to-digital converter (ADC) implemented with noise shaping.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

A successive approximation register (SAR) analog-to-digital converter (ADC) is commonly used in multiple applications due to its relatively low power and area consumption resultant from a SAR ADC's simple and efficient nature of binary searching. In addition, SAR ADCs may be implemented using switching circuitry that scales well with modern complementary metal-oxide-semiconductor (CMOS) technologies.

A SAR ADC may use a capacitor array as a digital-to-analog converter (DAC), a comparator for comparing a voltage at an output of the DAC with a reference voltage, and shift register logic for searching target voltage values at the input of the comparator. By nature, at the end of a conversion (or binary search) phase, quantization noise may be left over at the capacitor array, generally referred to as residual error or residual voltage. In some aspects of the present disclosure, the residual error may be further processed to increase the resolution associated with the SAR ADC.

One way to process the residual error may be to add a subsequent stage to resolve (e.g., convert to digital domain) the residual error. However, this technique implements a sub-ranging ADC architecture, which may have issues with respect to the alignment of the gain between a first stage and a subsequent stage. Another approach may be to have a memory for storing the residual information, such as a memory capacitor or integrator capacitor, which may be used to realize a noise-shaping SAR ADC. However, this technique may be implemented in the analog domain, adversely impacting the noise-shaping efficiency. Certain aspects of the present disclosure are directed to a SAR ADC implemented within a digital filter for noise shaping.

FIG. 1 is a block diagram illustrating a SAR ADC 100 implemented with residual error processing circuitry, in accordance with certain aspects of the present disclosure. As illustrated, the SAR ADC 100 includes a DAC implemented using a capacitor array 102 (CDAC) (also referred to as a "DAC capacitor array"), a comparator 104 to determine whether the voltage at sampling node 106 is less than or greater than some reference voltage, such as a common-mode voltage (Vcm) in this example, and SAR logic 108 (e.g., shift register logic) to search targeted voltage values at the input of the comparator. Based on the feedback from the output of the comparator 104, the SAR logic successively determines each of M-bits of a digital signal to be provided to the output 180 of the ADC, M being an integer greater than 1. The SAR logic 108 may be coupled to a control input of the capacitor array 102 and may selectively couple each of the capacitive elements of the capacitor array 102 to either a positive reference voltage (Vrefp) or a negative reference voltage (Vrefn) to set the voltage at sampling node 106 during a successive approximation phase until all M-bits have been resolved (e.g., determined). For example, the SAR logic may generate a digital signal (e.g., having M+1 bits) to selectively couple the capacitive elements of the capacitor array 102 to Vrefp and Vrefn.

Figure 2:
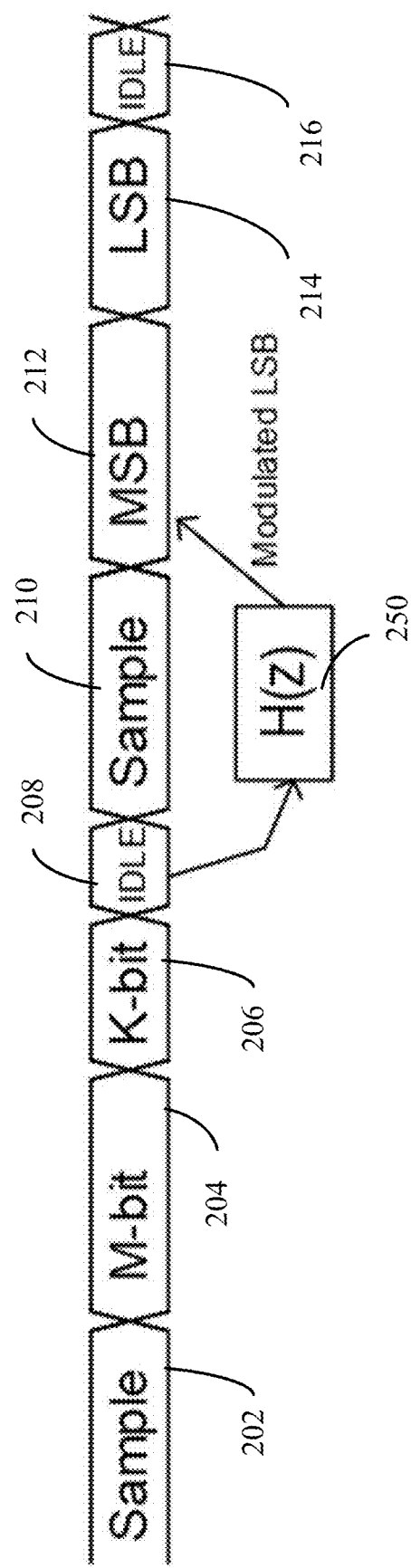
FIG. 2 is a timing diagram illustrating example phases associated with a SAR ADC, in accordance with certain aspects of the present disclosure.

FIG. 2 is a timing diagram illustrating example phases associated with the SAR ADC 100, in accordance with certain aspects of the present disclosure. As illustrated, during a sampling phase 202, switch 110 may be closed to sample the input voltage Vin at the sampling node 106. After the sampling phase 202, the M-bits are resolved during a successive approximation phase 204. Once the M-bits are resolved, a residual error voltage may remain at sampling node 106.

As illustrated in FIG. 1, a K-bit quantizer 112 may be used to convert the residual error voltage to a K-bit digital signal during a K-bit quantization phase 206. The K-bit digital signal (also referred to as K least significant bits (LSBs)) may be provided to a digital filter 114 for noise shaping. For example, the digital filter 114 may apply a transfer function H(z) 250. In some aspects, H(z) may be a delay function. After the K-bit quantization phase 206, a delay phase 208 (labeled "IDLE") may occur, followed by another sampling phase 210, and another successive approximation phase 212 for conversion of a voltage sampled at the sampling node 106 during the subsequent sampling phase 210 to another M-bit digital signal. After the delay associated with the transfer function H(z), the K-bit digital signal generated during the K-bit quantization phase 206 may be converted to an analog signal using a feedback DAC capacitive array ($C_{FBDAC}$) 116 and provided to the sampling node 106 such that the successive approximation phase 212 takes into account the residual error voltage.

In other words, the K-bit digital signal may be modulated by the digital filter 114 to provide a noise-shaping function. For example, the digital output (Dout) of the SAR ADC 100 (e.g., at output 180) may be represented by Vin+(1−H(z))×Kg×Qn, where Kg is the gain factor of the noise-shaping function, and Qn is the quantization noise associated with the generation of the M-bits. In some aspects, the digital filter 114 may implement a finite impulse response (FIR) filter. In certain aspects, H(z) may be represented by one of various z-domain expressions $z^-$, $2*z^{-1}-z^{-2}$, $3*z^{-1}+3*z^{-2}-z^{-3}$, or any order of delay in the digital domain, z being a complex variable of a z-transform function. In some aspects, noise shaping may be realized in a digital filter such as the digital filter 114. In other aspects, noise shaping may be implemented by changing feedback capacitive element's (e.g., $C_{FBDAC}$) bit weights. For example, the capacitance of the capacitive elements of the capacitor array 116 may be set to effectively implement a digital filter for noise shaping.

Figure 3:
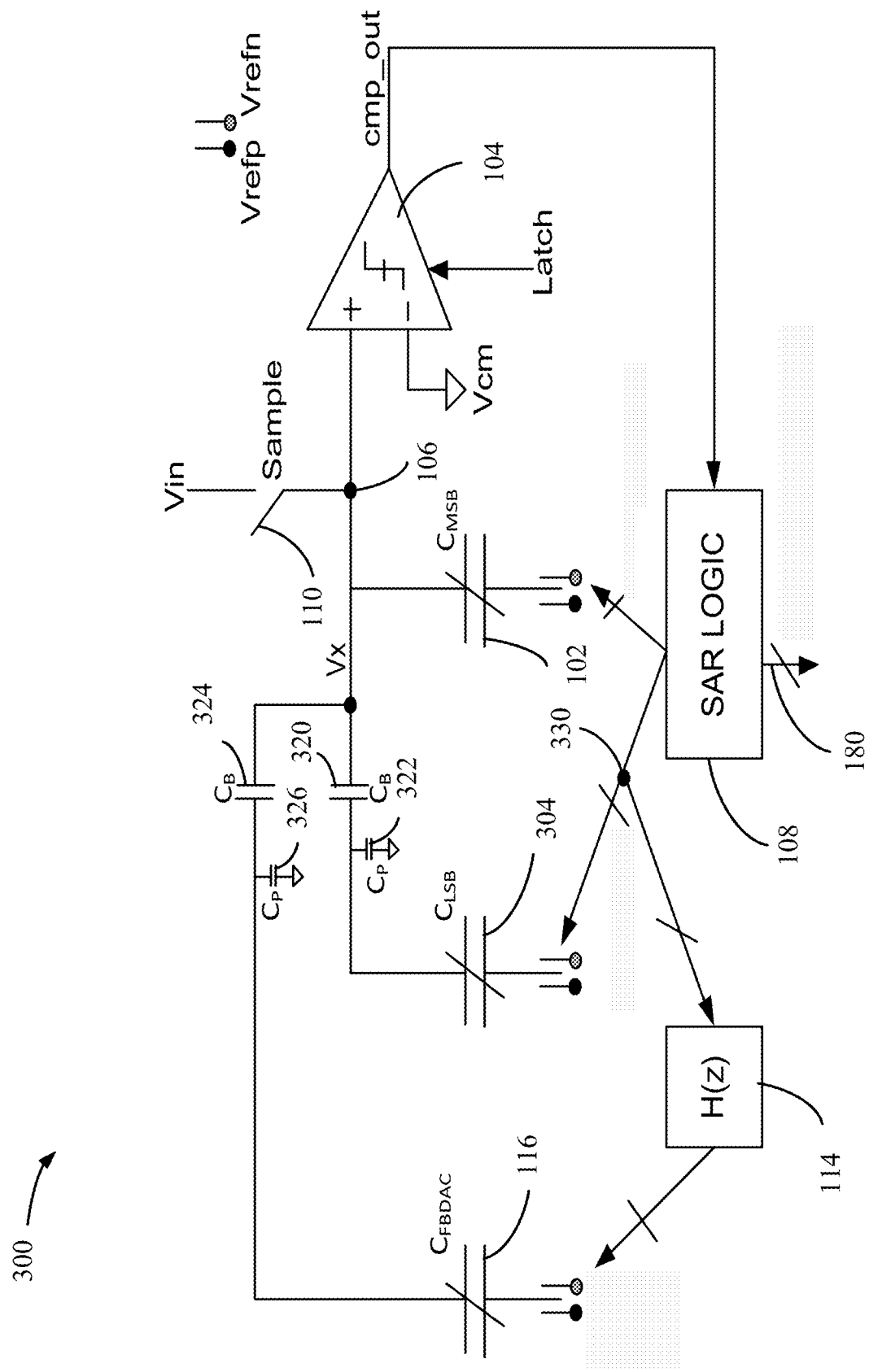
FIG. 3 illustrates a SAR ADC implemented with a capacitor array for conversion of a residual voltage to a digital signal, in accordance with certain aspects of the present disclosure.

FIG. 3 illustrates a SAR ADC 300 implemented with a capacitor array 304 ($C_{LSB}$) for conversion of a residual voltage to a digital signal, in accordance with certain aspects of the present disclosure. In other words, the quantizer 112 may be implemented using the capacitor array 304, which may be controlled by the SAR logic 108 to generate a digital representation (e.g., the K-bit digital signal) of the residual voltage at node 330. As illustrated, the SAR ADC 300 may include the capacitor array 102 (labeled as "$C_{MSB}$" in FIG. 3) for resolving the M-bits (also referred to as most significant bits (MSBs)). The SAR logic 108 may selectively couple each of the capacitive elements of the capacitor array 102 to Vrefp and Vrefn to resolve the M-bits of a digital output at the output 180.

Once the M-bits are resolved, the voltage remaining at sampling node 106 may be the residual voltage, as described herein. The SAR logic 108 may then control the capacitor array 304 to resolve (e.g., convert the residual voltage to a digital signal) the K-bits of the digital signal at node 330.

As illustrated, the capacitor array 304 may be coupled to the sampling node 106 through a bridging capacitive element 320 ($C_B$). $C_B$ may have a small capacitance as compared to the capacitor array 304, in order for capacitor array 304 to not impact the voltage at the sampling node 106 while the M-bits of the digital signal are being resolved. Moreover, a capacitive element 322 ($C_P$) may be coupled between the capacitor array 304 and a reference potential node (e.g., with Vcm), as illustrated.

As described, once the M-bits are resolved, the SAR logic 108 may selectively couple the capacitive elements of the capacitor array 304 to Vrefp and Vrefn to resolve the K-bits. Once the K-bits are resolved, the K-bits are provided to the digital filter 114, and the capacitor array 116 may be controlled to convert the K-bits to an analog signal at the sampling node 106 prior to a subsequent successive approximation phase (e.g., successive approximation phase 212), as described herein with respect to FIG. 2. The successive approximation phase 212 may be followed by another K-bit quantization phase 214 and another delay phase 216. As illustrated, the capacitor array 116 may be coupled to the sampling node 106 through a bridging capacitive element 324. Moreover, a capacitive element 326 may be coupled between the capacitor array 116 and the reference potential node (e.g., with Vcm), as illustrated.

Figure 4:
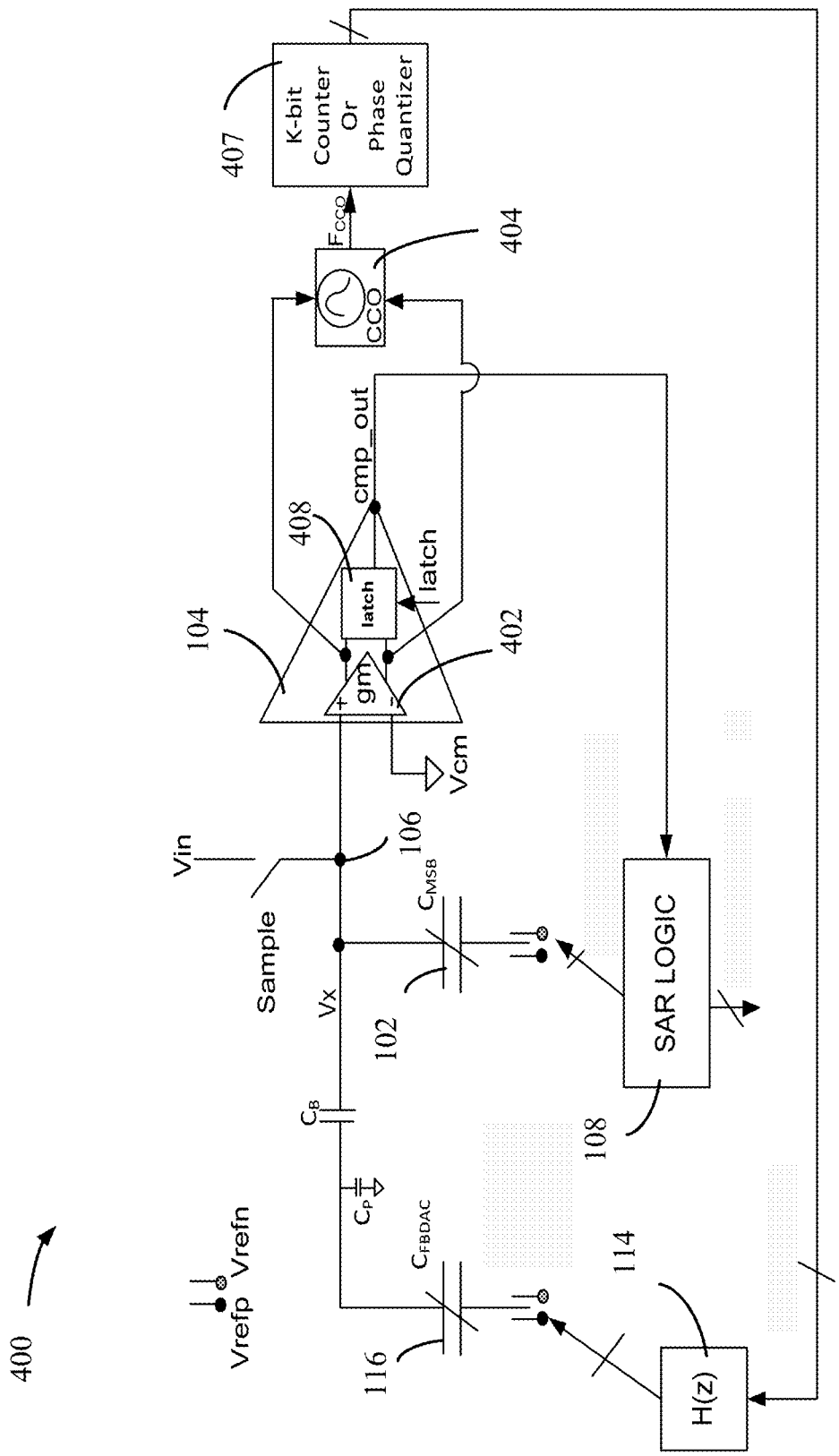
FIG. 4 illustrates a SAR DAC implemented using an oscillator, in accordance with certain aspects of the present disclosure.

FIG. 4 illustrates a SAR ADC 400 implemented using an oscillator 404, in accordance with certain aspects of the present disclosure. As illustrated, the comparator 104 may include a transconductance (gm) amplifier 402, which may convert the residual voltage at the sampling node 106 to a current to be provided to the oscillator 404. For example, the oscillator 404 may be a current-controlled oscillator (CCO), where a frequency of an output signal of the oscillator 404 is controlled by the current from the transconductance (gm) amplifier 402. Therefore, the frequency of the output signal of the oscillator 404 represents the residual voltage at the sampling node 106. As illustrated, a K-bit counter or phase quantizer 407 may be used to generate a K-bit digital signal representing the frequency of the oscillator output signal. The K-bit digital signal may be provided to the digital filter 114 for noise shaping, as described herein. In other words, the transconductance amplifier 402, the oscillator 404, and the K-bit counter or phase quantizer 407, effectively implement a quantizer (e.g., corresponding to quantizer 112) for converting the residual voltage to the digital domain.

By configuring the comparator 104 into a gm-cell (e.g., the gm amplifier 402), the residual voltage may be translated into a residual current to control the frequency of the CCO, as described herein. In some aspects, the oscillator 404 may be implemented as a voltage-controlled oscillator (VCO), and may be controlled directly using the residual voltage at sampling node 106 (or an amplified version thereof). The signal swing associated with the residual voltage may be small enough for the residual voltage to be linearly translated into the time domain by the oscillator 406. In some aspects, the comparator 104 may include a latch 408 between the output of the gm amplifier 402 and the SAR logic 108.

Figure 5:
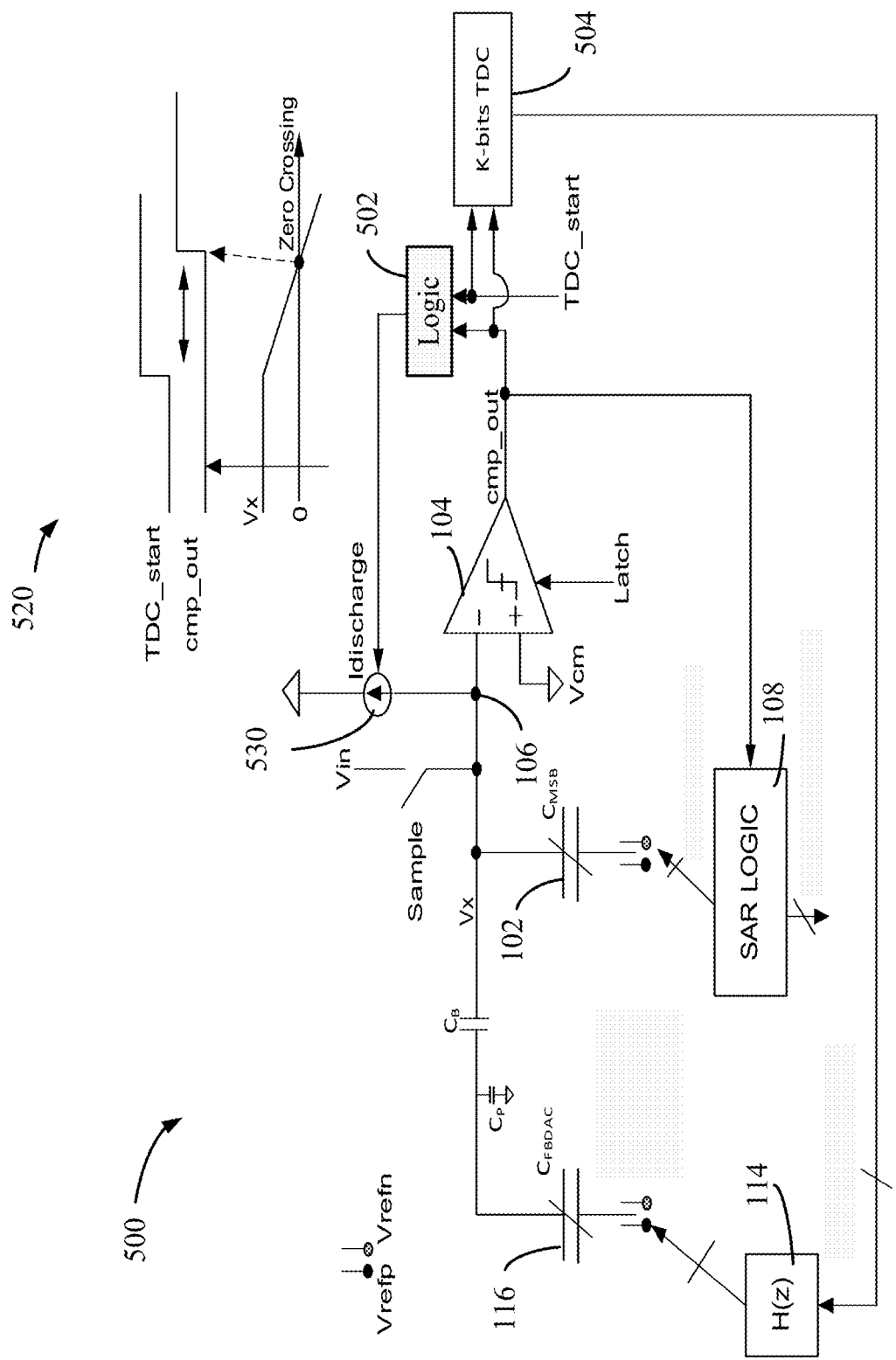
FIG. 5 illustrates a SAR ADC implemented with a time-to-digital converter (TDC), in accordance with certain aspects of the present disclosure.

FIG. 5 illustrates a SAR ADC 500 implemented with a time-to-digital converter (TDC), in accordance with certain aspects of the present disclosure. For example, the SAR ADC 500 may include logic 502 (e.g., an AND gate) having an input coupled to the output of the comparator 104. The other input of the logic 502 may be controlled via a TDC_start signal, which may also be provided to a K-bit TDC circuit 504. As described herein, after the M-bits are resolved, a residual voltage may remain at the sampling node 106. As illustrated in diagram 520, the TDC_start signal may transition from logic low to logic high, starting a counter for the TDC circuit 504. The logic 502 may be used to control a current source 530, configured to sink a current (labeled "Idischarge") from the sampling node 106, in effect reducing the voltage at the sampling node 106. For example, when the TDC_start signal transitions to logic high, the current source 530 may begin sinking current from the sampling node 106 such that the voltage at the sampling node 106 decreases. Once the voltage at the sampling node 106 reaches zero volts (e.g., Vcm), the output voltage (cmp_out signal) of the comparator 104 transitions to logic high. The TDC 504 detects the time difference between the rising edge of the TDC_start signal, and the rising edge of the cmp_out signal, and provides a digital signal representing the time difference. Thus, the digital signal from the TDC circuit 504 represents the residual voltage and may be provided to the digital filter 114 for noise shaping, as described herein. Thus, the current source 530, the logic 502, and TDC circuit 504 in effect implement a quantizer (e.g., corresponding to quantizer 112) for converting the residual voltage to the digital domain.

Figure 6:
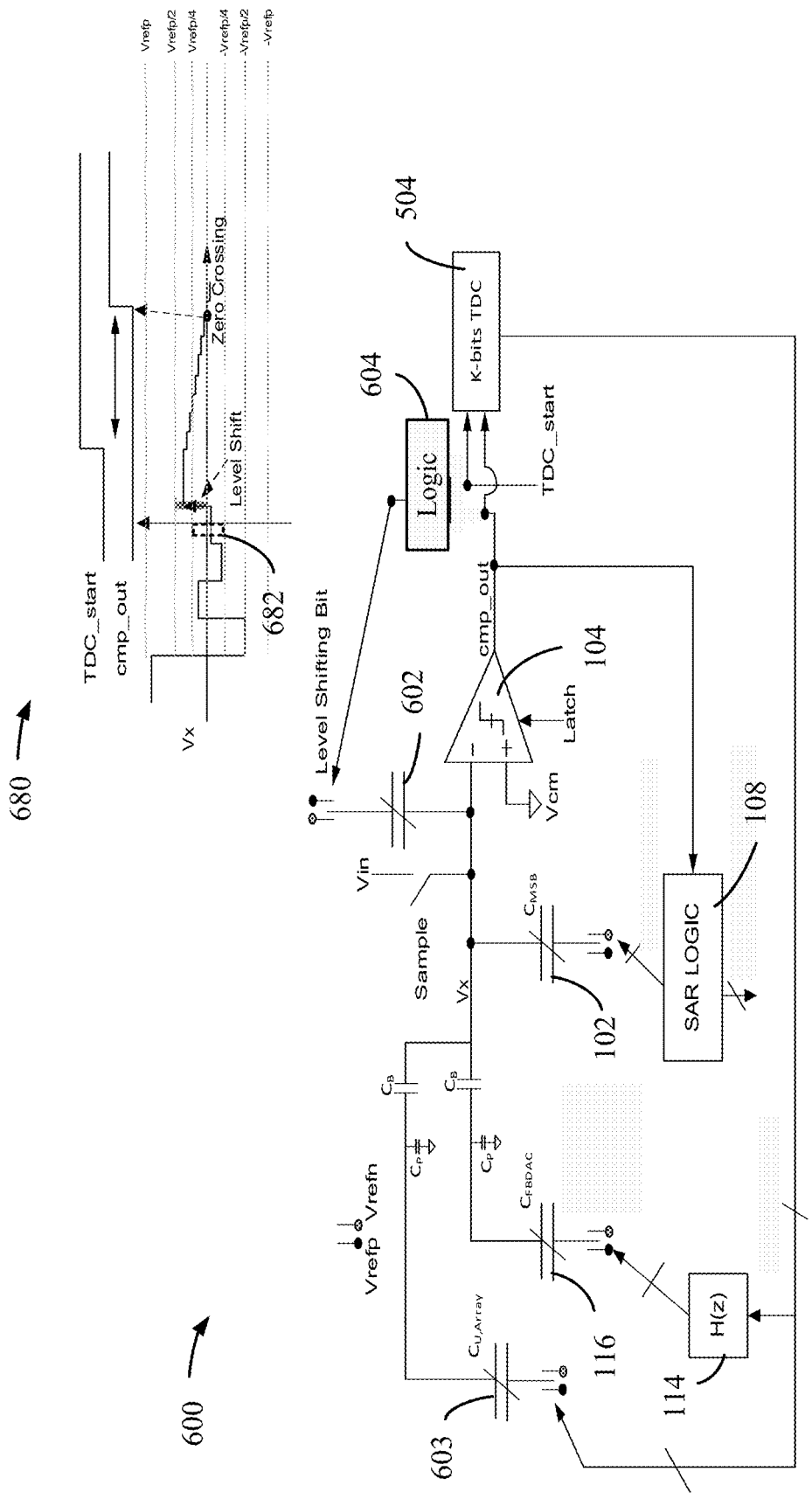
FIG. 6 illustrates a SAR ADC implemented using a unit capacitive array, in accordance with certain aspects of the present disclosure.

FIG. 6 illustrates a SAR ADC 600 implemented using a unit capacitor array 603 ($C_{U\_Array}$), in accordance with certain aspects of the present disclosure. As illustrated, the SAR ADC 600 may include a level-shifting circuit 602 (e.g., implemented using one or more capacitive elements), which may be controlled by a level-shifting bit by logic 604 to increase the voltage at the sampling node 106. After the M-bits of a digital output signal of the SAR ADC 600 are resolved, the voltage at the sampling node 106 may be either positive or negative. For instance, as illustrated in diagram 680, the voltage at the sampling node 106 (labeled "Vx") may be negative at time period 682. Therefore, after the M-bits are resolved, the voltage at the sampling node 106 may be increased via the level-shifting circuit 602 such that the voltage at sampling node 106 is positive, as illustrated.

The TDC_start signal may then transition to logic high, at which point, the TDC circuit 504 may begin incrementing the K-bit digital signal at the output of the TDC circuit 504. The K-bit digital signal may be used to control the unit capacitor array 603. For example, the capacitive elements of the capacitor array 603 may be selectively coupled to Vrefp and Vrefn, stepping down the voltage at sampling node 106 in LSB-step-size units (e.g., step size unit associated with the K-bits). Once the voltage at the sampling node 106 reaches zero volts (e.g., Vcm), the cmp_out signal transitions to logic high, as illustrated. When the cmp_out signal transitions to logic high, the K-bit digital signal at the output of the TDC circuit 504 may represent the residual voltage, and may be provided to the digital filter 114 for noise shaping, as described herein.

In other words, a TDC-based quantizer may be used to resolve the K-bit digital signal. The current source 530 of the SAR ADC 500 is replaced with a unit array DAC (e.g., unit capacitor array 603) to implement a digital slope when discharging the voltage at the sampling node 106. After the M-bits are resolved, the voltage at the sampling node 106 is first level shifted via the level-shifting circuit 602, and the unit capacitor array 603 starts to step down the voltage at the sampling node 106 based on the digital signal generated by the TDC circuit 504. The comparator 104 is configured to be a continuous comparator to monitor the zero volt crossing of the voltage at the sampling node 106, as described herein. The TDC circuit 504 is quantizing the number of steps to generate the K-bit digital signal.

Certain aspects of the present disclosure provide techniques for quantizing residual voltage after an M-bit analog-to-digital conversion phase. The K-bit digital information representing the residual voltage may be provided to a digital filter for noise shaping, which may be any type of filter such as a finite impulse response (FIR) or an infinite impulse response (IIR) filter. The modulated K-bit digital signal may be applied to a feedback DAC (e.g., capacitor array 116) in order for a subsequent conversion phase to realize quantization noise cancellation. In certain aspects, any gain error between the M-bit and K-bit conversions may have little to no impact on performance because the K-bit digital signal is only used for noise shaping. Thus, the gain error may only impact the noise shaping applied via the digital filter 114 without jeopardizing the performance of the SAR ADC. The digital filter 114 may be managed to realize an $N^{th}$-order noise shaping to efficiently improve the signal-to-noise ratio associated with the SAR ADC.

Figure 7:
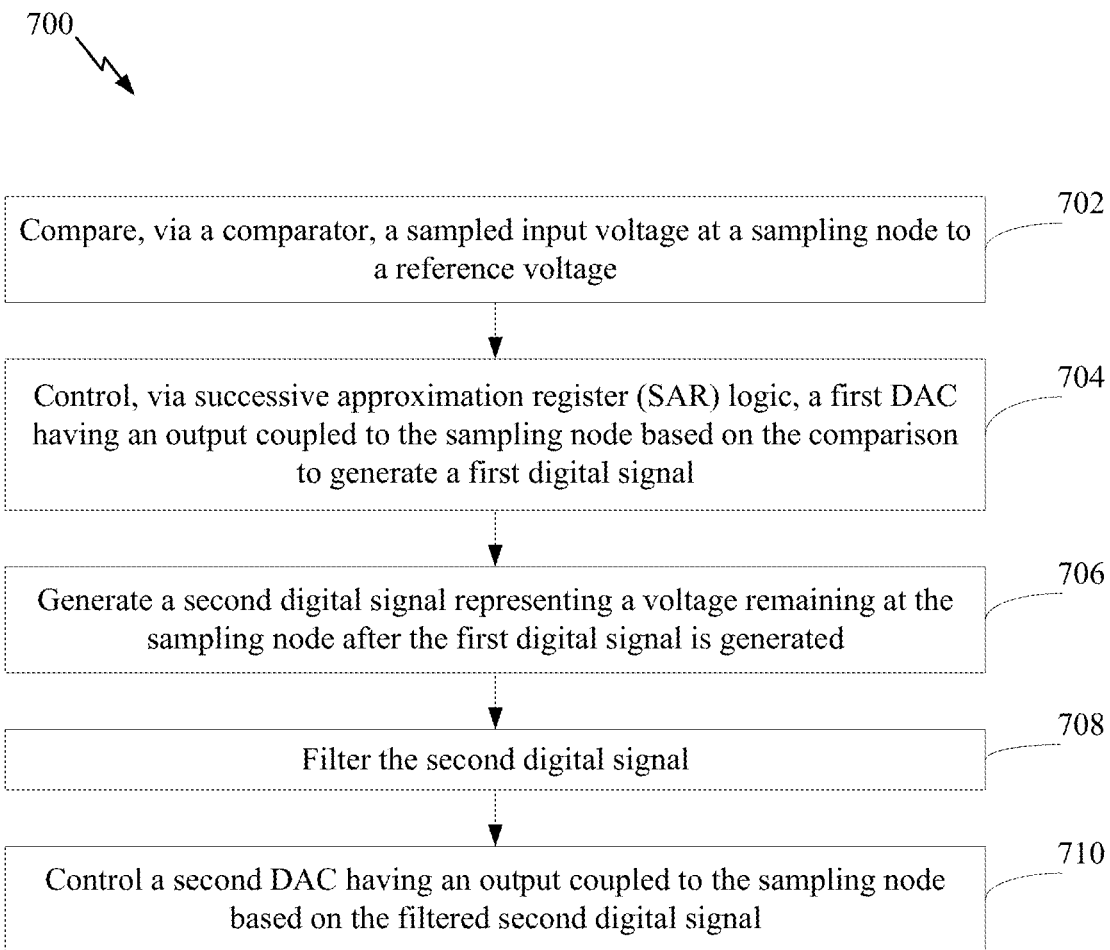
FIG. 7 is a flow diagram of example operations for analog-to-digital conversion, in accordance with certain aspects of the present disclosure.

FIG. 7 is a flow diagram of example operations 700 for analog-to-digital conversion, in accordance with certain aspects of the present disclosure. The operations 700 may be performed by a SAR ADC, such as the SAR ADCs 100, 300, 400, 500, and 600.

The operations 700 may begin, at block 702, with the SAR ADC comparing (e.g., via comparator 104) a sampled input voltage at a sampling node (e.g., sampling node 106) to a reference voltage. At block 704, the SAR ADC may control (e.g., via SAR logic 108), a first DAC (e.g., capacitor array 102) having an output coupled to the sampling node based on the comparison to generate a first digital signal (e.g., M-bit digital signal), and at block 706, generate a second digital signal (e.g., K-bit digital signal) representing a voltage (e.g., residual voltage) remaining at the sampling node after the first digital signal is generated. At block 708, the SAR ADC may filter (e.g., via digital filter 114) the second digital signal, and at block 710, control a second DAC (e.g., capacitor array 116) having an output coupled to the sampling node based on the filtered second digital signal.

In certain aspects, generating the second digital signal at block 706 may include generating (e.g., via oscillator 406) an oscillating signal based on the voltage at the sampling node, the second digital signal being generated (e.g., via a counter or phase quantizer 407) based on the oscillating signal. In some cases, the SAR ADC may also convert (e.g., via transconductance amplifier 402) the voltage remaining at the sampling node to a current, the oscillating signal being generated based on the current.

In some aspects, generating the second digital signal may include sinking (e.g., via current source 530) a current from the sampling node to begin reducing the voltage remaining at the sampling node, and determine (e.g., via TDC circuit 504), a time period from when the reduction in the voltage begins and when the voltage at the sampling node reaches a reference voltage, the second digital signal being generated based on the time period.

In some aspects, generating the second digital signal may include reducing (e.g., via a capacitor array 116) the voltage at the sampling node, and determining (e.g., via TDC circuit 504), a time period from when the reduction in the voltage at the sampling node begins and when the voltage at the sampling node reaches a reference voltage, the second digital signal being generated based on the time period.

The various operations of methods described above may be performed by any suitable means capable of performing the corresponding functions. The means may include various hardware and/or module(s), including, but not limited to a circuit, an application-specific integrated circuit (ASIC), or processor. Generally, where there are operations illustrated in figures, those operations may have corresponding counterpart means-plus-function components with similar numbering. For example, means for comparing may include a comparator, such as the comparator 104. Means for controlling may include SAR logic, such as the SAR logic 108. Means for generating may include a quantizer, such as the quantizer 112. Means for filtering may include a digital filter, such as the digital filter 114. Means for controlling may include a capacitor array, such as the capacitor array 116.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. In addition, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for analog-to-digital conversion, comprising:
a first digital-to-analog converter (DAC) having an output coupled to a sampling node;
a comparator having an input coupled to the sampling node;
successive approximation register (SAR) logic having an input coupled to an output of the comparator and at least one output coupled to an input of the first DAC;
a quantizer configured to generate a first digital signal representing a voltage at the sampling node, wherein the quantizer comprises:

an oscillator having a control input coupled to the sampling node; and a counter or phase quantizer configured to generate the first digital signal based on an output signal of the oscillator;

a digital filter configured to filter the first digital signal; and a second DAC configured to generate an analog signal representing the filtered first digital signal and provide the analog signal to the sampling node.

2. The circuit of claim 1, wherein the first DAC, the comparator, and the SAR logic are configured to generate a second digital signal representing a sampled voltage at the sampling node, and wherein the first digital signal represents a residual voltage at the sampling node after the generation of the second digital signal.

3. The circuit of claim 1, wherein the digital filter and the second DAC are implemented using a capacitor array.

4. The circuit of claim 1, wherein the quantizer is coupled between the sampling node and the digital filter.

5. The circuit of claim 1, wherein the quantizer comprises a capacitor array coupled to the sampling node, a control input of the capacitor array being coupled to the at least one output of the SAR logic.

6. The circuit of claim 1, further comprising a transconductance amplifier having an input coupled to the sampling node, wherein the oscillator comprises a current-controlled oscillator, the control input of the current-controlled oscillator being coupled to an output of the transconductance amplifier.

7. A circuit for analog-to-digital conversion, comprising:
a first digital-to-analog converter (DAC) having an output coupled to a sampling node;
a comparator having an input coupled to the sampling node;
successive approximation register (SAR) logic having an input coupled to an output of the comparator and at least one output coupled to an input of the first DAC;
a quantizer configured to generate a first digital signal representing a voltage at the sampling node;
a digital filter configured to filter the first digital signal; and
a second DAC configured to generate an analog signal representing the filtered first digital signal and provide the analog signal to the sampling node, wherein the quantizer comprises:
a current source configured to sink a current from the sampling node to begin reducing the voltage at the sampling node; and
a time-to-digital converter (TDC) configured to determine a time period from when the reduction in the voltage begins and when the voltage at the sampling node reaches a reference voltage, the TDC being further configured to generate the first digital signal based on the time period.

8. The circuit of claim 7, wherein the quantizer further comprises logic configured to begin the reduction of the voltage at the sampling node based on a TDC start signal.

9. A circuit for analog-to-digital conversion, comprising:
a first digital-to-analog converter (DAC) having an output coupled to a sampling node;
a comparator having an input coupled to the sampling node;
successive approximation register (SAR) logic having an input coupled to an output of the comparator and at least one output coupled to an input of the first DAC;
a quantizer configured to generate a first digital signal representing a voltage at the sampling node;
a digital filter configured to filter the first digital signal; and
a second DAC configured to generate an analog signal representing the filtered first digital signal and provide the analog signal to the sampling node, wherein the quantizer comprises:
a capacitor array configured to reduce the voltage at the sampling node; and
a time-to-digital converter (TDC) configured to determine a time period from when the reduction in the voltage at the sampling node begins and when the voltage at the sampling node reaches a reference voltage, the TDC being further configured to generate the first digital signal based on the time period.

10. The circuit of claim 9, wherein the TDC is configured to control the capacitor array to reduce the voltage at the sampling node via the first digital signal.

11. The circuit of claim 9, wherein the quantizer further comprises a level-shifting circuit configured to increase the voltage at the sampling node prior to the capacitor array reducing the voltage at the sampling node.

12. The circuit of claim 11, wherein the level-shifting circuit comprises one or more capacitive elements coupled to the sampling node.

13. The circuit of claim 1, wherein the first DAC comprises a DAC capacitor array, and wherein the second DAC comprises a feedback (FB) DAC capacitor array.

14. The circuit of claim 1, wherein the SAR logic is configured to generate the first digital signal.

* * * * *